(12) United States Patent
Hsu

(10) Patent No.: US 6,265,888 B1
(45) Date of Patent: Jul. 24, 2001

(54) WAFER PROBE CARD

(75) Inventor: Howard Hsu, Sunnyvale, CA (US)

(73) Assignee: SCS Hightech, Inc., Taipei (TW)

( * ) Notice: Subject to any disclaimer, the term of this patent is extended or adjusted under 35 U.S.C. 154(b) by 0 days.

(21) Appl. No.: 09/275,503

(22) Filed: Mar. 24, 1999

(30) Foreign Application Priority Data

Mar. 27, 1998 (TW) ................................ 87104656

(51) Int. Cl.[7] .......................... G01R 31/28; G01R 1/073
(52) U.S. Cl. .................... 324/760; 324/765; 324/754
(58) Field of Search .................... 324/754, 755, 324/760, 765

(56) References Cited

U.S. PATENT DOCUMENTS

| | | | |
|---|---|---|---|
| 4,065,717 | * 12/1977 | Kattner et al. | 324/765 |
| 5,325,052 | * 6/1994 | Yamashita | 324/765 |
| 5,568,054 | * 10/1996 | Iino et al. | 324/760 |
| 5,945,834 | * 8/1999 | Nakata et al. | 324/754 |

\* cited by examiner

Primary Examiner—Ernest Karlsen
(74) Attorney, Agent, or Firm—Hogan & Hartson, LLP

(57) ABSTRACT

An apparatus to heat and test a semiconductor wafer includes a probe card and tests a plurality of die simultaneously at the wafer level. In the present invention, the apparatus heats the wafer to sufficient temperatures to perform burn-in and a speed test. A method of testing the semiconductor allows certain die to be repaired that would otherwise be scrapped in a conventional process where bun-in and other tests are performed on packaged die. The method also eliminates steps associated with handling individually packaged parts, reduces burn-in space and consolidates certain test steps.

18 Claims, 4 Drawing Sheets

WAFER PROBE CARD

BACKGROUND OF THE INVENTION

1. Field of the Invention

The present invention relates generally to semiconductor testing devices and to testing and/or burn-in methods for semiconductor devices, and particularly to the testing of high density integrated circuits such as DRAMs, SRAMs and embedded devices including "system on a chip" and graphic accelerators with embedded DRAM.

2. Description of the Related Art

Integrated circuit devices, including DRAM and SRAM memory devices, are typically tested several times at the wafer level and again after dicing and packaging to ensure device quality and reliability. In a conventional testing process, individual devices on the wafer are tested to distinguish good devices from defective ones. The defects found at this stage of testing typically originated during device fabrication. If redundant circuits are present on the devices, a test/sort process is performed to detect reparable devices, which are typically laser repaired to activate the redundant circuitry. The good devices are sorted from the irreparable defective devices. A wafer separation unit, such as a scribe and break mechanism, separates the wafer into individual devices or die, and the good devices are individually packaged. After packaging, a pre-burn-in test (or open/short test) is typically performed to screen out packaging assembly defects, for example shorts or the existence of leakage current that will further degrade during burn-in. Burn-in is then performed in the form of a reliability stress test designed to accelerate failure mechanisms by operating at elevated temperatures. Following burn-in, a post burn-in test is performed to screen out the burn-in stress test defects. Those devices lost during burn-in are devices that likely would fail before the end of their specified life during normal operation. Defects are identified in these parts because the failure modes of the parts are accelerated by the burn-in process. The devices are then unloaded from the burn-in apparatus and a speed test at high temperature is performed. The packaged devices are then marked, and final tests are carried out to ensure that they will operate reliably at room temperature. Consequently, four or five different tests and anywhere from four to seventy-six hours of burn-in are required to ensure the quality and reliability of any given device.

High-density memory integrated circuits, e.g. 64 megabit or larger memory chips, require even longer test times than prior generation memories, since more time is needed to test these larger memory chips due to the longer execution test pattern. In addition, to achieve an acceptable level of yield from high density memories, extra die repair tests and processes are typically needed. At the end of these test and repair cycles, often 60–80% of the finally yielded good parts have undergone repairs. This more significant level of testing required by higher density memories can be costly and time-consuming. Conventional wafer probe technology may only test a single die at a time, or at most, up to 32 die simultaneously, and simultaneous testing of a greater number of die is constrained, in part, by the physical limitation of probe tip design.

Conventional wafer probing systems have relatively long probe tips which cause impedance mismatch problems when tests are carried out on the high density memory units. As the density of a device increases, high speed testing becomes necessary, and the tester must have good high frequency characteristics. Accordingly, probe lengths should be reduced as much as possible to allow testing at high speed or at high temperatures using a high frequency test signal. Due to the above limitations, post burn-in testing of high speed devices is typically performed after packaging. Such discrete component testing requires a large quantity of expensive burn-in systems, burn-in boards with expensive sockets that can accept packaged units, and additional labor associated with the loading and unloading of individual devices to and from the burn-in board. Further, these conventional processes typically scrap an additional one to three percent of the devices after post burn-in that would otherwise have been repairable through activation of redundant circuitry had they not been packaged before the burn-in test. The total cost per yielded packaged device is therefore unnecessarily increased by the equipment cost of the discrete component testing, the loss of devices that would be repairable had their defects been detected at the wafer level and the requirement of additional test cycles for the packaged parts. Accordingly, there is a need for a wafer level defect and reliability testing apparatus that can also perform many of the tests that currently take place after packaging. For example, it would be advantageous to perform the burn-in and high-temperature/high speed testing on all devices simultaneously while they are still in wafer form.

SUMMARY OF THE PREFERRED EMBODIMENTS

The present invention relates to a probe card with a short probe length to enable high temperature, high speed testing of high density devices while reducing the impedance mismatching problems typically associated with such testing. The invention may also relate to a probing and heating apparatus that uses the probe card to enable substrate level testing at elevated temperatures and methods for using the apparatus to test and burn-in devices at the substrate, e.g. wafer, level.

A probe card for electrically interfacing a plurality of devices on a substrate to be tested to a testing unit includes a plurality of probe tips disposed on a surface of the probe card facing the substrate and arranged in a manner corresponding to a plurality of contact pads on the devices of the substrate. The probe card also includes a plurality of signal contacts for conducting signals to and from the testing unit, each signal contact electrically connected to a probe tip. Use of preferred embodiments of the present invention may provide reduced impedance mismatch during high speed testing of high density semiconductor devices.

The probe card described is included in a substrate probing and heating apparatus for testing the electrical characteristics of a plurality devices on a substrate at a plurality of temperatures. The probing and heating apparatus also includes a support unit to align and hold the substrate and the probe card to one another. The support unit includes two support members that may be disengagably coupled to one another. A substrate is removably mounted on a planar surface of the first support member, the substrate having device contact pads facing away from the planar surface. The first support member also includes a heater. The probe card is removably mounted on a second support member. The apparatus also includes a means for disengagably coupling the first member and the second member to one another in a fixed position with the substrate and probe card therebetween to achieve electrical contact between each probe tip of the probe card and the corresponding contact pad of the substrate. Use of preferred embodiments of the present invention may allow testing of high density devices at high speeds in substrate form thereby eliminating a number of steps of the conventional process required when the substrate is separated into individual packaged units before performing certain tests such as burn-in.

A method for handling and testing a plurality of devices on a substrate at a plurality of temperatures includes the steps of providing a substrate having a plurality of devices to be tested through a plurality of contact pads, providing a probing and heating apparatus as described above, a defect testing system and a heater driver/control unit. The substrate is mounted on the first member of the support unit and the two support members are coupled to one another. The substrate is then heated to a pre-determined temperature and the electrical characteristics of the devices are tested with the tester while the devices are maintained at the pre-determined temperature. In other embodiments additional steps are performed, such as providing a laser circuit repair unit and repairing defective devices detected during testing, distinguishing the good devices from the defective devices, providing a substrate separation unit to separate the substrate into individual devices, separating the substrate into individual devices using the substrate separation unit and sorting the good devices for packaging and final test.

Embodiments of the present invention are of particular use when the tested substrate is a semiconductor wafer containing high density memory circuits.

The invention will be best understood from the following description when read in conjunction with the accompanying drawings.

BRIEF DESCRIPTION OF THE DRAWINGS

FIG. 2b is a bottom view of the embodiment of FIG. 2a.

DETAILED DESCRIPTION OF THE PREFERRED EMBODIMENTS

The present invention relates to a probe card with a short probe length to enable high temperature, high speed testing of high density devices while reducing the impedance mismatching problems typically associated with such testing. Other aspects of the invention relate to a probing and heating apparatus that uses a probe card in accordance with the invention to enable substrate level testing at elevated temperatures. Still other aspects of the invention relate to methods for using the apparatus to handle, test and burn-in devices on a substrate.

Figure 1A:
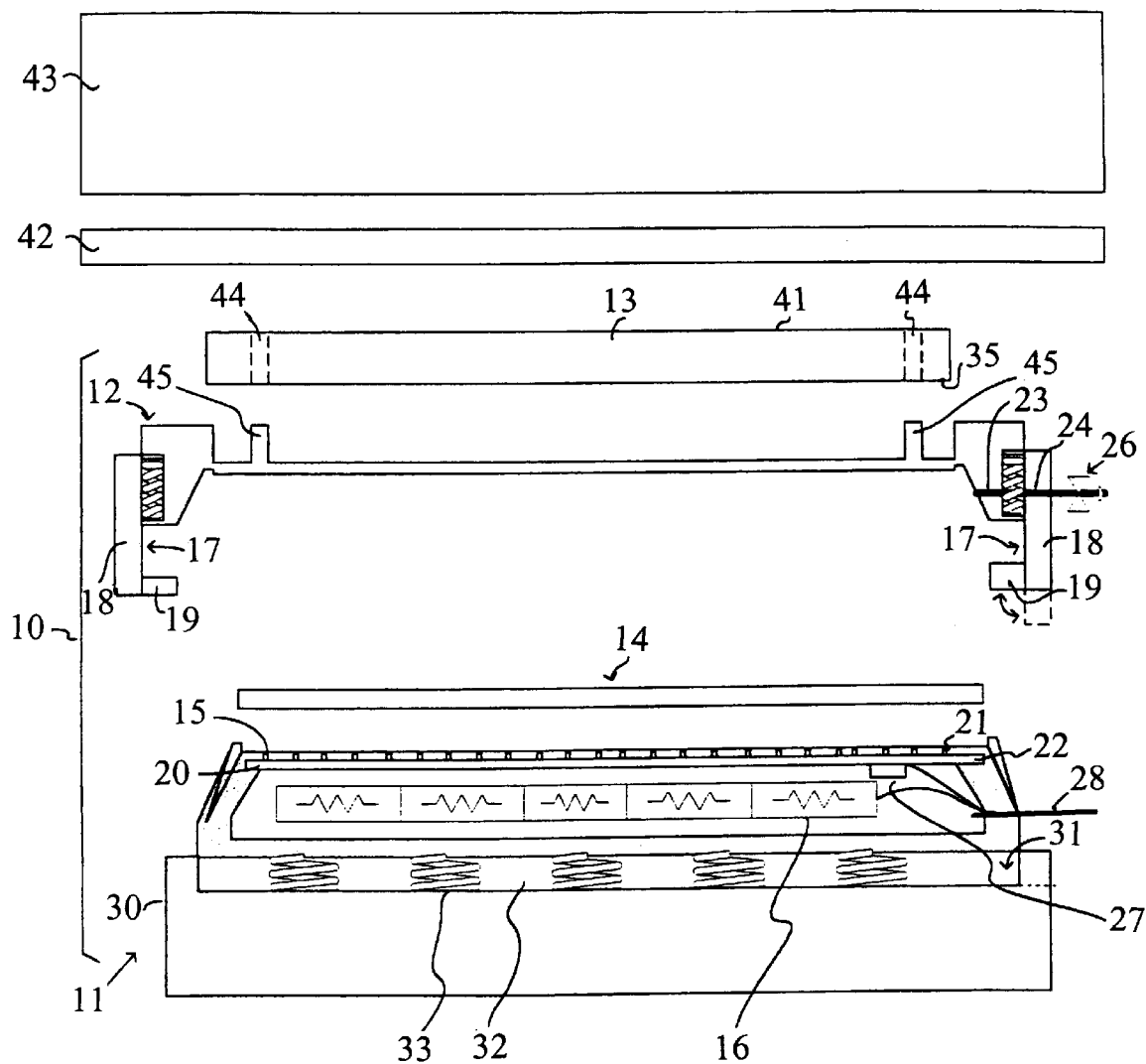
FIG. 1a is an exploded lateral sectional view of an embodiment of the substrate probing and heating apparatus.
Figure 1B:
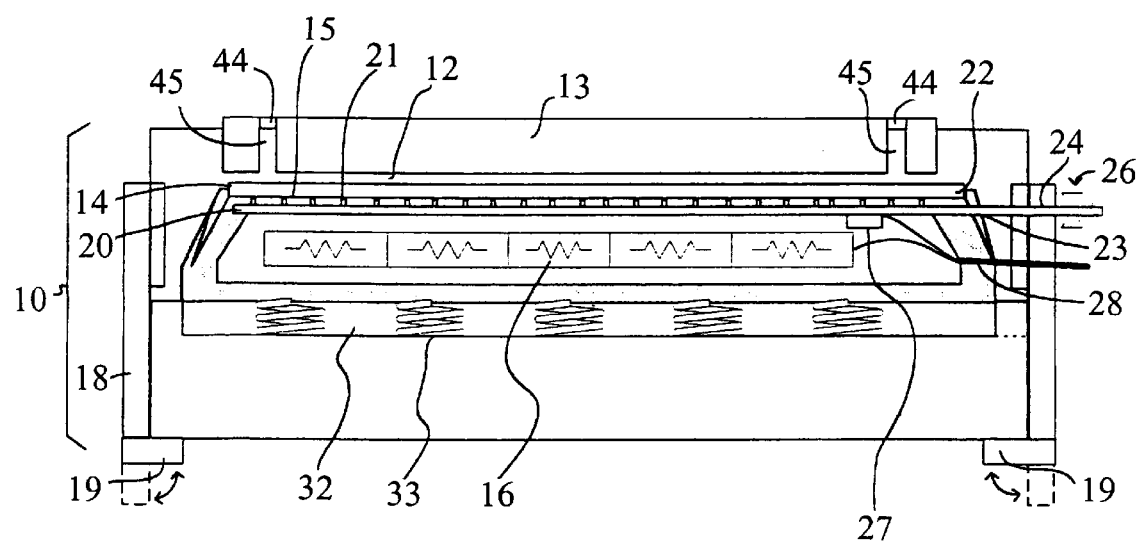
FIG. 1b is a lateral sectional view of the embodiment of FIG. 1a assembled.

As shown in FIGS. 1a and 1b (collectively, FIG. 1), an embodiment of a substrate heating and testing apparatus 10 may include a support unit that includes a first support member 11, a second support member 12 and a probe card 13. A substrate 14, for example a semiconductor wafer, can be removably mounted on the first support member on a planar surface 15. The substrate has a plurality of devices (not shown) having a plurality of contact pads (not shown) that face away from the planar surface 15. The first support member also includes a heater 16. The probe card 13 is removably mounted on the second support member 12. The probe card 13 has a plurality of probe tips 34 (FIG. 3) that are disposed on the surface of the probe card that faces the substrate 14 (FIG. 1). Each probe tip is electrically connected to a signal lead for conducting signals between an external tester and the probe tip. The support unit also includes a means for disengagably coupling the first member and the second member to one another in a fixed position to achieve alignment and electrical contact between the probe tips of the probe card 13 and the contact pads of the substrate 14. In some embodiments, the coupling means is a mechanical clasp that fixes the two members to one another. In the embodiment of FIG. 1, the mechanical clasp includes two L-shaped hinges 17, each coupled to a support member. Each hinge has two arms, a first arm 18 coupled to the second support member and a second arm 19 pivotally associated with the first arm 18. The second arm may pivot about the first so that it comes to rest at an open position having an approximate 180° angle with the first arm as shown in the phantom drawing of FIG. 1. When both second arms 19, 19 are in this open position, the support members may be brought together and coupled to one another as shown in FIG. 1b. The second arm may then be pivoted about the first to lock into an approximate 90° angle, thereby coupling the two support members to one another. Although FIG. 1 shows both hinges coupled to the second support member, other coupling configurations will be apparent.

Preferably, the substrate heating and probing apparatus 10 simultaneously tests a plurality of devices on the substrate over a range of pre-selected test conditions, at least one at an elevated temperature. Most preferably, the apparatus 10 tests all devices on the substrate simultaneously.

The embodiment shown in FIG. 1 includes a vacuum hold-down device to removably mount the substrate 14 to the planar surface 15 and substantially flatten it when sufficient vacuum is applied. In the embodiment of FIG. 1, the vacuum hold-down device includes a region of the first support member surrounding a vacuum cavity 20. The cavity 20 is in fluid communication with the external environment through an array of first orifices 21, each having an opening in the planar surface 15 of the first member 11. In the preferred embodiment of FIG. 1, there are a plurality of first orifice elements although other configurations are possible. The cavity 20 is also in fluid communication with the external environment through a second orifice 22, having an opening at a surface of the first member not in contact with the substrate. When an external vacuum source (not shown) is applied to the external opening of the second orifice, pressure in the cavity 20 is reduced below ambient, drawing a vacuum at the external opening of the first orifice 21. The substrate 14 is thereby drawn to the planar surface 15 of the first member 11. Such a vacuum at the planar surface 15 allows the substrate 14 placed thereon to be held substantially flat against the surface 15. In the embodiment of FIG. 1, the second orifice 22 is sealably associated with an end 23 of a vacuum tube 24 housed in the second support member 12 when both members are engaged. An external vacuum source may be applied to the opposite end of the vacuum tube 24. The tube 24 may optionally include a vacuum control valve 26 that is sealed to hold the wafer in place over the course of testing.

The embodiment of FIG. 1 further includes a temperature sensor 27 in the proximity of the planar surface 15. The sensor is operationally connectable to an external heater driver and control unit (not shown) through a conductive path 28. In a preferred embodiment, the sensor 27 and the external heater driver control unit operate within a feedback and control system, the sensor sensing a first temperature and supplying a first temperature signal to the heater driver and control unit, the control unit comparing the first temperature signal to a stored temperature signal and adjusting the heater driver unit to reduce any difference between the signals. Accordingly, the desired substrate temperature can be maintained at a temperature substantially the same as the stored (target test) temperature.

The embodiment of FIG. 1 further includes a buffer to cushion the force of the probe card against the substrate contacts and to apply pressure to maintain electrical contact. In this embodiment of the buffer, the first support member 11 is divided into two plates 29, 30 in a plane parallel to the planar surface 15. One plate slidably engages the other plate about the periphery of the plates. In the embodiment of FIG. 1, the top plate 29, which includes the vacuum cavity 20, the first orifice 21, the second orifice 22 and the heater 16, slidably inserts into a recess 31 of the bottom plate 30. Other similarly functioning configurations will be appreciated by those of ordinary skill in the art. Sliding the two plates in opposite directions creates a gap 32 therebetween. In the embodiment of FIG. 1, the top plate 29 slides in an upward direction and the bottom plate 30 slides in a downward direction to create the gap 32. In preferred embodiments, an elastic member 33 is disposed within the gap between the two plates 29, 30. The elastic member 33 is biased to sustain the gap 32 and hold the contact pads (not shown) of the substrate 14 against the probe tips (not shown) of the probe card 13 to enable electrical contact therebetween. In the embodiment of FIG. 1, the elastic member 33 is a spring, biased upwardly. In certain embodiments, a plurality of elastic elements are disposed within the gap, for example, the plurality of springs shown in FIG. 1. The relative resilience of the elastic member also inhibits excess pressure on the substrate contacts and the probe tips of the probe card when the two support members are engaged.

Figure 2A:
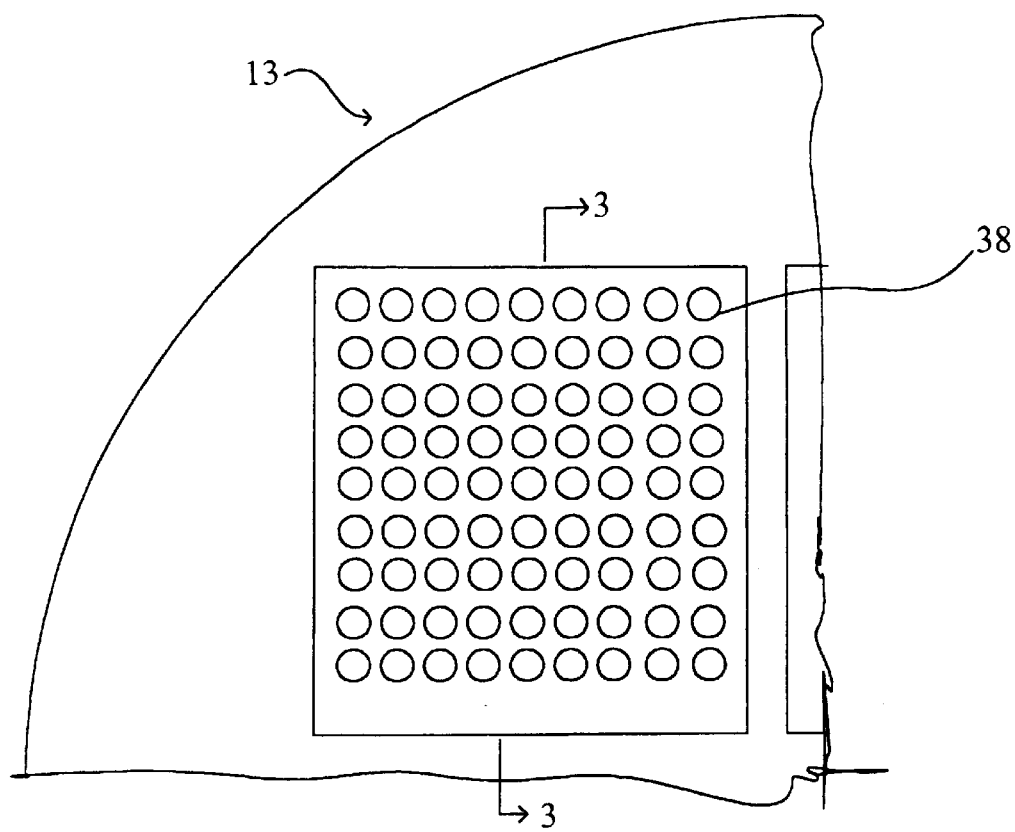
FIG. 2a is a top view of a detail of an embodiment of a probe card.
Figure 2B:
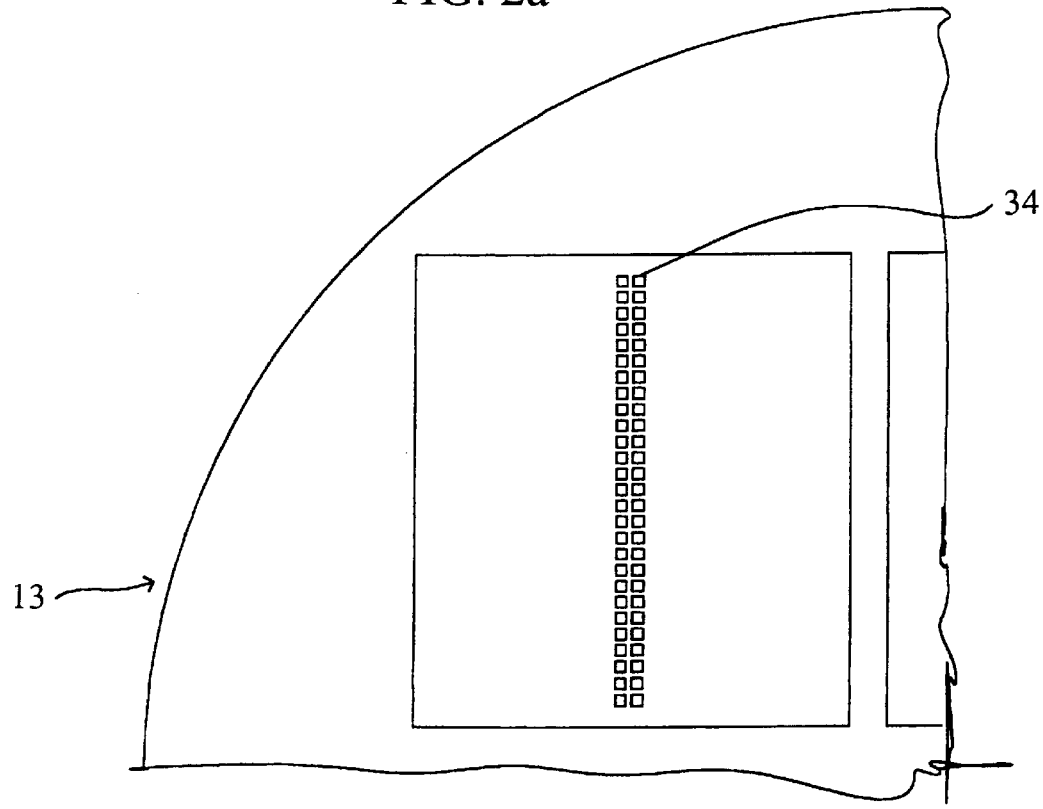
Figure 3:
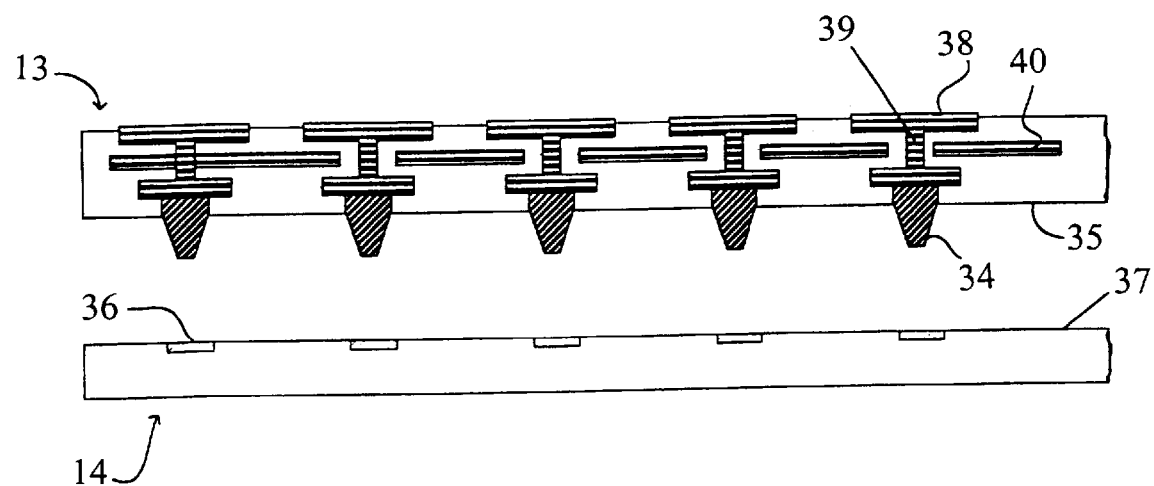
FIG. 3 is a lateral sectional view of a detail of an embodiment of the probe card of FIG. 2a through section line 3—3 aligned above a lateral sectional view of a substrate.

Details of an embodiment of a probe card 13 for electrically interfacing a plurality of contact pads on a substrate to a testing unit are shown in FIGS. 2a, 2b and 3. FIG. 3 is a lateral section of a detail of an embodiment of the probe card of FIG. 2a through section line 3—3, shown aligned above a section of a substrate 14 showing a plurality of probe tips 34 on a surface 35 of the probe card that faces the substrate 14. The probe tips 34 are arranged in a manner corresponding to a plurality of contact pads 36 on the devices of the substrate 14 so that when the probe tip surface 35 of the probe card 13 faces the contact pad surface 37 of the substrate 14 in proper alignment, each probe tip will electrically contact a contact pad. FIG. 3 also shows a plurality of signal contacts 38 on the probe card 13 for conducting signals to and from a testing unit (not shown). Each signal contact is electrically connected to a probe tip. In a preferred embodiment, as shown in FIG. 3, each probe tip 34 extends beyond the surface 35 of the probe card and the probe conductive path 39 between a given signal contact and its corresponding probe tip is shortened to the greatest extent possible to reduce the impedance mismatch problems previously discussed that are exacerbated as the probe wire lengthens. In a preferred embodiment, each signal contact 38 is electrically associated with a ground plane 40 to minimize interference among individual signals.

FIG. 2a is a top elevation of the embodiment of the probe card just described in FIG. 3, showing a plurality of signal contacts 38. FIG. 2b is a bottom view of the embodiment of the probe card of FIG. 3, showing a plurality of probe tips 34. Some of the more numerous signal contacts 38 may be connected to more than one probe tip 34. This may allow different tests to be performed without repositioning the probe card or may allow the probe card to be used with multiple testers. It should be appreciated that different circuits, for example having different loads or impedance matching characteristics, might be included in the different connection paths provided by the embodiments of FIGS. 2a and 2b. The probe card 13 and certain of its elements, for instance the signal contacts 38 and any circuits can be manufactured using standard printed circuit board ("PCB") technology. In one embodiment, the signal contacts 38 and circuits (not shown) are made from boron tungsten. In another embodiment, they are made from copper. Other conductive materials having good electrical properties might also be used. The probe tips 34 can be manufactured using standard fabrication technology. Preferred embodiments of the probe tips 32 include tungsten, although other conductive materials with good durability properties may be used.

PCB technology is desirable for the board due to the low cost and ready availability of the technology. Different length connection paths can be provided to achieve impedance matching to sets of contact points for different tests. Providing such connection paths or providing different circuits for testing is greatly facilitated using the multi-layer fabrication provided by printed circuit board technology.

Returning to the embodiment of FIG. 1a, the plural signal contacts (not shown) associated with the upper surface 41 of the probe card 13, and the circuits of certain embodiments, enable direct electrical coupling to a load board of a tester (not shown) or burn-in board. In a preferred embodiment, an adapter 42 electrically interfaces between the signal contacts of the probe card and an external device, for example, the load board 43 of a tester or a burn-in board. These adapters, which can be variously configured, further facilitate use of standard load board and burn-in board equipment to interface with the probe card.

In a preferred embodiment, the probe card 13 includes an alignment mechanism to removably mount the probe card 13 to the second support member 12, providing alignment for electrical contact between each probe tip of the probe card and the corresponding contact pad on the substrate when the two support members are coupled to one another. In some embodiments, the alignment mechanism comprises a plurality of receiving cavities in the probe tip surface 35 of the probe card 13, and a plurality of protrusions from the surface of the second support member where the probe card is mounted, each protrusion sidably insertable into a corresponding receiving cavity in the probe card when the probe card is mounted on the second support. Most preferably, the alignment mechanisms are spaced about the periphery of the support member 12 so as not to interfere with the central area that provides testing access to the wafer under test. These alignment mechanisms assure proper alignment between the probe tips of the probe card and the corresponding contact pads of the substrate when the two support members are coupled to one another. In the embodiment of FIG. 1, the receiving cavities in the probe card are alignment holes 44 and the protrusions are cylindrical pillars 45 projecting upward from the surface of the second support member. Each of the pillars 45 slidably inserts into the corresponding alignment hole 44 of the probe card when the probe card is properly mated to the second support member. Various shapes and layouts of cavities and protrusions can be used that assure a desired unique orientation of the probe card on the second support.

The substrate probing and heating apparatus is particularly suitable for testing integrated circuits on a semiconductor wafer, and especially high density devices such as SRAM and DRAM memories. Other particularly well-suited applications include testing embedded devices, system on a chip (SOC) devices and other special circuits.

An embodiment of a method for handling and testing a plurality of devices on a substrate at a plurality of temperatures includes the steps of first providing a substrate having a plurality of devices to be tested through a plurality of contact pads, a probing and heating apparatus and a probe card, each as described herein, a device testing system operationally associated and electrically connected to each signal point on the probe card and a heater driver and control unit operationally associated with the heater in the probing and heating apparatus. The substrate is mounted on the first support so that the contact pads of the substrate face the probe tips of the probe card, and the two supports are coupled to one another so that the probe tips electrically contact the contact pads. Next, the substrate is heated to a pre-determined testing temperature, and then the electrical characteristics of the devices are tested with the tester while the devices are maintained at the pre-determined temperature. Thus burn-in testing can be performed at the substrate level, for example wafer level, without the need for first packaging the parts. Further, the testing can be done at high speed, because unwanted impedance mismatch effects have been minimized by the probe card design and construction.

In a preferred embodiment in which the devices are reparable devices with redundant circuitry, following the testing step, the method further includes the steps of providing a laser circuit repair unit, disengaging the two support members from one another and repairing defective devices detected during testing using the laser circuit repair unit to activate the redundant circuitry of the device. Although wafers tested as above can be shipped as final products or applications, in many application packaged parts are desired. For such applications, following the step of repairing the defective devices the method further comprises the steps of providing a substrate separation unit to separate the substrate into individual devices, distinguishing the good devices from the defective devices, separating the substrate into individual devices using the substrate separation unit, and sorting the good devices. These good devices may then be packaged, marked and finally tested as discrete units.

For comparison, a conventional testing method may include: (1) sorting at room temperature, currently up to thirty-two devices at a time, (2) redundancy testing, (3) sorting the repaired devices, (4) packaging the devices, (5) pre burn-in testing (open/short test), (6) loading parts for burning-in testing, (7) burn-in, (8) unloading parts after burn-in testing, (9) post burn-in testing (speed testing at high temperatures), (10) marking the packaged devices and (11) final testing at room temperature. In processes embodying aspects of in the present invention, a number of steps typically performed are eliminated, thus greatly reducing testing time and cost. For instance, the steps of initial sort at room temperature and post burn-in can be merged into one test. Additionally, it is possible that one or more other tests might be avoided, including the redundancy test, loading and unloading of packaged parts from the burn-in board, and pre-burn-in in test. In addition, a number of devices that are typically scrapped in the conventional process can be laser repaired because defects are identified before packaging. Reduction of unnecessary packaging of initially defective, but repairable, die also saves costs.

Although the present invention has been described in detail with reference only to the presently-preferred embodiments, those of ordinary skill will appreciate that various modifications can be made without departing from the invention. Accordingly, the invention is defined by the following claims.

I claim:

1. A substrate probing and heating apparatus for testing the electrical characteristics of a plurality devices on a semiconductor wafer substrate at a plurality of temperatures, the apparatus comprising:

a probe card sized to probe all devices on a semiconductor wafer substrate, the probe card having a plurality of probe tips and signal contacts positioned over a surface of the probe card corresponding to devices on a semiconductor wafer substrate to be tested, the probe tips disposed on a surface of the probe card facing the substrate and arranged in a manner corresponding to a plurality of contact pads on the substrate, each probe tip electrically connected to a signal contact for transmitting signals between an external tester and the probe tip, the probe card including a ground plane within the probe card, the ground plane extending between the plurality of probe tips and the plurality of signal contacts, at least one of the contact pads in electrical contact with the ground plane; and a support unit comprising:
a first support member on which the substrate is removably mounted on a planar surface, the substrate having contact pads facing away from the planar surface of the member, the member having a heater;
a second support member on which the probe card is removably mounted; and
a means for disengagably coupling the first member and the second member to one another in a fixed position with the substrate and probe card therebetween to achieve electrical contact between each probe tip of the probe card and the corresponding contact pad of the substrate.

2. The substrate probing and heating apparatus of claim 1, wherein a vacuum hold-down device is used to removably mount the substrate to the planar surface of the first member.

3. The substrate probing and heating apparatus of claim 2, wherein the vacuum hold-down device comprises:

a region of the first member surrounding a vacuum cavity, the cavity in fluid communication with the external environment through a first orifice having an opening in the planar surface of the first member and through a second orifice having an opening in a surface of the first member not in contact with the substrate, wherein an external vacuum source applied to the second orifice reduces the pressure in the cavity and the first orifice below ambient pressure to draw the substrate to the planar surface of the first member.

4. The substrate probing and heating apparatus of claim 1, wherein the first support member further includes a temperature sensor suitable for use with an external heater driver and control unit.

5. The substrate probing and heating apparatus of claim 1, wherein the disengagable coupling means is a mechanical clasp that fixes the two members to one another.

6. The substrate probing and heating apparatus of claim 1, wherein an alignment mechanism is used to removably mount the probe card to the second support member providing alignment for electrical contact between probe tips of the probe card and corresponding contact pads on the substrate when the two support members are coupled to one another.

7. The substrate probing and heating apparatus of claim 1, wherein the first support member is divided into two plates in a plane parallel to the planar surface, and one plate of the first support member slidably engages the other plate, wherein sliding the two plates in opposite directions creates a gap therebetween.

8. The substrate probing and heating apparatus of claim 7, wherein an elastic member is disposed in the gap between the two plates of the first support member, the elastic member biased to sustain the gap and hold the contact pads of the substrate against the probe tips enabling electrical contact therebetween.

9. The substrate probing and heating apparatus of claim 1, further comprising an adapter to electrically interface between the signal contacts of the probe card and an external device.

10. The substrate probing and heating apparatus of claim 9, wherein the external device is a load board of a tester.

11. The substrate probing and heating apparatus of claim 9, wherein the external device is a burn-in board.

12. The substrate probing and heating apparatus of claim 1, wherein the devices tested by the apparatus are integrated circuits and the substrate is a wafer.

13. The apparatus of claim 1, wherein a greater number of signal contacts are provided than probe tips.

14. The apparatus of claim 13, further comprising:
a plurality of circuits each associated with a given signal contact, the plurality of circuits associated with one probe tip.

15. The apparatus of claim 14, wherein wafer fabrication technology is used to build the signal contacts and circuits.

16. The apparatus of claim 13, wherein the probe card is a multi-layer printed circuit board.

17. The apparatus of claim 13, wherein the signal contacts comprise copper.

18. The apparatus of claim 13, wherein the probe tips comprise tungsten.

* * * * *

UNITED STATES PATENT AND TRADEMARK OFFICE
CERTIFICATE OF CORRECTION

PATENT NO. : 6,265,888 B1
DATED : July 24, 2001
INVENTOR(S) : Howard Hsu

Page 1 of 1

It is certified that error appears in the above-identified patent and that said Letters Patent is hereby corrected as shown below:

Column 1,
After the "Description of the Related Art", a paragraph break should be inserted.

Column 3,
Line 33, delete "alateral" and insert -- a lateral --.

Signed and Sealed this

Twenty-ninth Day of January, 2002

Attest:

Attesting Officer

JAMES E. ROGAN
Director of the United States Patent and Trademark Office